US006924980B2

(12) United States Patent
Lehman et al.

(10) Patent No.: US 6,924,980 B2
(45) Date of Patent: Aug. 2, 2005

(54) VIBRATION ISOLATION OF COMPUTING DEVICE HEAT SINK FANS FROM ATTACHED FAN SHROUDS AND HEAT SINKS

(75) Inventors: Bret W. Lehman, Raleigh, NC (US); Beth Frayne Loebach, Raleigh, NC (US); Albert Vincent Makley, Raleigh, NC (US); Jason Aaron Matteson, Raleigh, NC (US)

(73) Assignee: International Business Machines Corporation, Armonk, NY (US)

( * ) Notice: Subject to any disclaimer, the term of this patent is extended or adjusted under 35 U.S.C. 154(b) by 117 days.

(21) Appl. No.: 10/607,958

(22) Filed: Jun. 27, 2003

(65) Prior Publication Data

US 2004/0264129 A1 Dec. 30, 2004

(51) Int. Cl.[7] ............................................. H05K 7/20
(52) U.S. Cl. ....................... 361/695; 361/690; 257/718; 257/721; 257/727; 174/16.1; 174/16.3; 165/80.3; 165/185
(58) Field of Search ................................ 361/695, 697, 361/709; 174/16.1, 16.3; 165/80.3, 120; 257/718, 722; 415/211.2

(56) References Cited

U.S. PATENT DOCUMENTS

| | | | | |
|---|---|---|---|---|
| 4,568,243 A | * | 2/1986 | Schubert et al. | ......... 415/213.1 |
| 4,819,503 A | | 4/1989 | Fazi, Jr. et al. | |
| 4,997,034 A | | 3/1991 | Steffen et al. | |
| 5,101,321 A | | 3/1992 | Remise et al. | |
| 5,186,605 A | | 2/1993 | Tracy | |
| 5,664,624 A | * | 9/1997 | Tsai et al. | ................... 165/80.3 |
| 5,680,295 A | | 10/1997 | Le et al. | |
| 5,754,401 A | * | 5/1998 | Saneinejad et al. | ......... 361/705 |
| 5,917,698 A | | 6/1999 | Viallet | |
| 6,181,556 B1 | | 1/2001 | Allman | |
| 6,351,380 B1 | * | 2/2002 | Curlee et al. | ................ 361/695 |
| 6,352,103 B1 | | 3/2002 | Chu et al. | |
| 6,401,806 B1 | * | 6/2002 | Lee et al. | ................... 165/80.3 |
| 6,401,807 B1 | | 6/2002 | Wyler et al. | |
| 6,427,763 B1 | * | 8/2002 | Matsumoto | ................. 165/80.3 |
| 6,538,888 B1 | * | 3/2003 | Wei et al. | .................... 361/697 |
| 6,667,884 B1 | * | 12/2003 | Lee et al. | .................... 361/697 |
| 6,712,127 B2 | * | 3/2004 | Lee | ............................. 365/80.3 |
| 6,722,418 B2 | * | 4/2004 | Zhang | ........................ 165/80.3 |
| 2003/0007867 A1 | * | 1/2003 | Chang | ........................ 415/220 |

FOREIGN PATENT DOCUMENTS

| | | | | |
|---|---|---|---|---|
| JP | 05167280 A | * | 7/1993 | ............ H05K/7/20 |
| JP | 11-87962 A | | 9/1997 | |

* cited by examiner

Primary Examiner—Boris Chervinsky
(74) Attorney, Agent, or Firm—Lally & Lally LLP

(57) ABSTRACT

A device for use in cooling a microelectronic component in a data processing system with a heat sink and a fan. The device includes means for maintaining the fan in close proximity to the heat sink and in a position relative to the fan for moving air over cooling surfaces of the heat sink and component to vibrationally isolate the fan from the heat sink and reduce the transmission of fan vibration to the heat sink. In one embodiment, the vibration isolation component is also configured to receive the fan and secure the fan in position relative to the heat sink to locate the fan in a predetermined position relative to the heat sink. In another embodiment, the vibration isolation component comprises a compliant gasket defining an opening adapted to receive an active area of the fan to allow air flow generated by the fan to reach the heat sink.

17 Claims, 4 Drawing Sheets

VIBRATION ISOLATION OF COMPUTING DEVICE HEAT SINK FANS FROM ATTACHED FAN SHROUDS AND HEAT SINKS

BACKGROUND

1. Field of the Invention

The present invention is in the field of computing systems and more particularly in the field of cooling microelectronic devices within a system and reducing acoustical noise generated by the system.

2. Background

In a competitive market, particularly the market for personal computing devices, customers will weigh the characteristics of products from multiple producers before a purchase is made. Different customers and geographies, have dissimilar opinions with regards to what makes a "quality" computing device. The most commonly sought after attributes of a computing device are processor speed, disk capacity, memory size, cost, graphics capability, form factor, and appearance. These attributes tend to be comparable among the various producers of computing systems.

The most rapidly growing area of interest for customers is acoustics or noise. Many customers now weight the acoustical characteristics of a system as highly significant in determining the quality of the system. Currently the primary elements operative in the production of system acoustical noise are the system's various electro-mechanical cooling fans the including system fans, microelectronic component fans, and power supply fans.

Microelectronic component fans, commonly known as fan-sinks, include a fan and heat sink assembly utilized to cool an individual microelectronic component. A fan-sink includes a heat sink, a fan, and a fan-shroud, which affixes to the heat sink and to which the fan is affixed. Conventional fan shrouds rigidly tie together the fan and the heat sink. Initially, the fan is affixed and secured to the fan shroud by screws, typically four. Next the fan/fan-shroud sub-assembly is affixed to the heat sink by tabs (typically four) that are bent around the base of the heat sink. This rigid mounting scheme can cause excitement between the fan and the fan shroud and between the fan shroud and the heat sink. This excitement creates undesired sound power and an increased sound pressure at the operator's position. It would be desirable to reduced or eliminate the transmission of vibration in a fan sink assembly and thereby reduce the sound power and pressures experienced by the end-user.

SUMMARY OF THE INVENTION

The problem identified above are addressed by a novel fan/heat sink assembly according to the present invention. The assembly incorporates a vibration isolating element into the assembly of fan and heat sink. The vibration isolating element is interposed between the fan and any other elements of the assembly affixed to it. The transmission of vibrational energy is reduced or eliminated by the use of a material, such as an elastomer, with a high damping coefficient, for the vibration-isolating element. Such a material will internally damp out vibrations from the fan and reduce or eliminate their transmission and subsequent re-radiation as acoustic noise, thus reducing the sound power transmitted by the computing device.

BRIEF DESCRIPTION OF THE DRAWINGS

Other objects and advantages of the invention will become apparent upon reading the following detailed description and upon reference to the accompanying drawings in which like reference numerals indicate like elements.

DETAILED DESCRIPTION OF THE EMBODIMENTS

Figure 1:
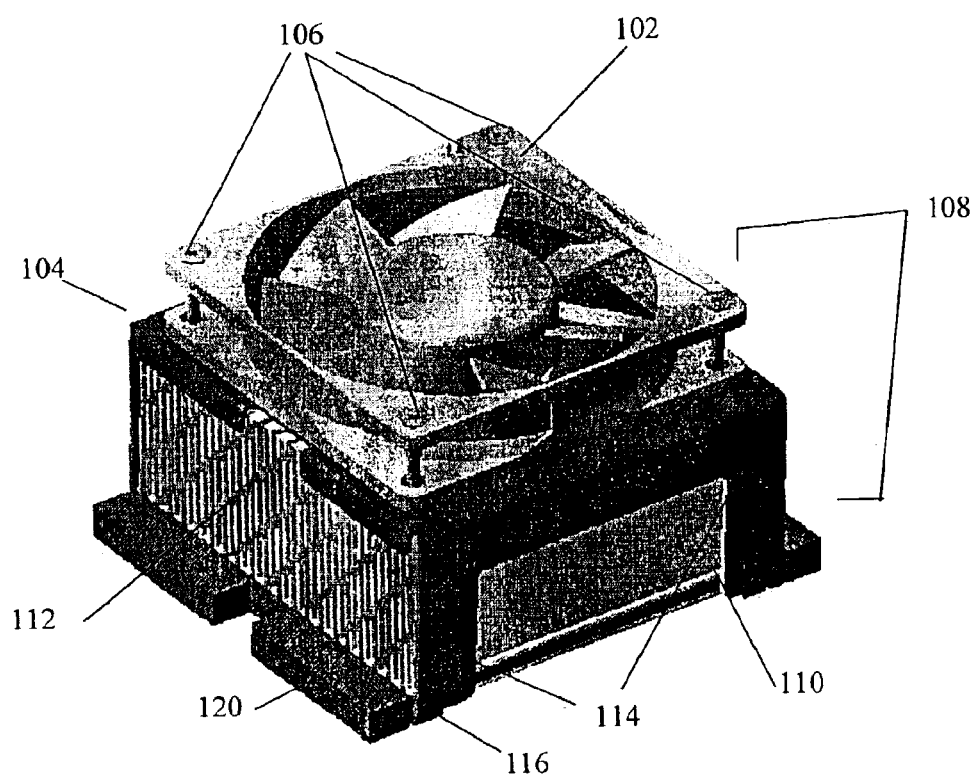
FIG. 1 depicts the physical mounting scheme for the attachment of a fan to a heat sink, according to the prior art.

The following is a detailed description of example embodiments of the invention depicted in the accompanying drawings. The example embodiments are in such detail as to clearly communicate the invention. However, the amount of detail offered is not intended to limit the anticipated variations or embodiments, but on the contrary, the intention is to cover all modifications, equivalents, and alternatives falling within the spirit and scope of the present invention as defined by the appended claims. The detailed descriptions below are designed to make such embodiments obvious to a person of ordinary skill in the art.

Generally speaking, the present invention contemplates a fan sink assembly with desirable acoustics characteristics for reduced noise generation in a data processing system. The fan sink assembly includes a heat sink, a fan, a fan shroud, and a vibration isolation component. In use, the assembly affixes to a microelectronic device, such as a microprocessor, affixed to a printed wiring board using a thermally conductive material. The assembly functions to cool the microelectronic device. The heat generated by the microelectronic component transfers to the heat sink by conduction through the thermally conducting materially. The fan moves air through the openings in the heat sink, removing heat from the heat sink by convective cooling. The net effect is to move heat from the microelectronic device to the ambient air, thus cooling the microelectronic device.

In a conventional fan sink assembly, the fan is rigidly affixed using, typically, four screws to a fan shroud, which in turn rigidly affixes to the heat sink by means of legs. The fan shroud legs are capable of being slightly elastically deformed allowing the shroud and fan sub-assembly to be affixed to a heat sink. The fan shroud legs then return to their original position, thus affixing the sub-assembly to the heat sink.

The fan is a rotational device and as such generates a finite amount of vibrational energy as a result of the mass of the fan motor and blades being slightly out of balance around the axis of rotation. Due to the rigid mounting of the fan to the fan shroud, the vibrational energy is transferred to the fan shroud. The fan shroud—fan subassembly is then rigidly mounted to the heat sink, again allowing transmission of vibrational energy to the heat sink. The heat sink may take any of a number of conventional forms, such as a rectangular array of pins (pin-fin heat sink) or thin blades, integrated with a solid base of material to which the fan shroud legs affix. The mechanical structure of the heat sink lends itself to the re-transmission of vibrational energy as sound pressure, thus raising the acoustic noise level of the computing system.

It is common for such computing systems to have ventilation structures on the front face (the face closest to the operator for a personal computer system). Since the internal structure of the cooling device is designed to move air through the ventilation holes, the sound pressure developed by the vibration of the heat sink will preferentially radiate out of the front of the machine, increasing the noise level of the system relative to the operator.

The insertion of a vibration isolation component into the fan sink assembly as described herein reduces or prevents the transmission of vibrational energy from the fan to other components to which it is affixed. The reduction or elimination of vibrational energy from the fan reduces or eliminates the vibrational energy which can subsequently be transmitted as acoustic noise.

Turning now to the drawings, FIG. 1 depicts a conventional heat sink, fan, fan shroud (fan sink) assembly 100. The fan 102 is rigidly affixed to the fan shroud 104 by means of screws 106, typically located on the four corners of the fan. The result is a fan-fan shroud sub assembly 108.

The heat sink 110 includes an array of pins or fins 112 affixed to a solid base 120. The fan-fan shroud subassembly 108 affixes to the base of the heat sink 120 by means of flexible legs 114 which are capable of deforming elastically a sufficient amount to allow the formed members or feet 116 at the base of the legs 114 to capture the heat sink 110 between opposing pairs of legs 114.

Figure 2:
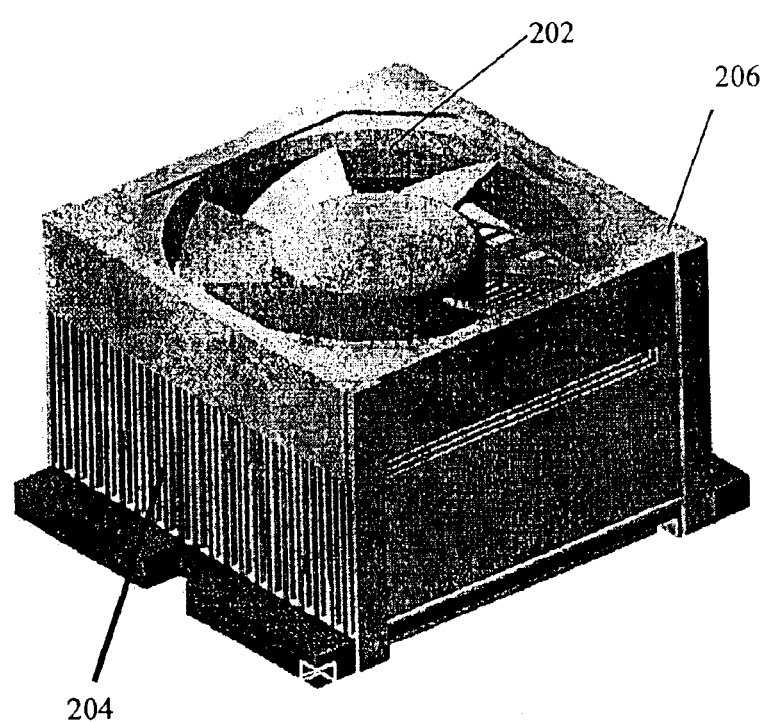
FIG. 2 depicts selected elements of a fan sink assembly according to the present invention emphasizing a heat sink, a fan, and an integral fan shroud-vibration isolation component that affixes the fan to the heat sink and prevents the transmission of vibrational energy from the fan to the heat sink.

Referring now to FIG. 2, one embodiment of a fan sink assembly 200 according to the present invention is depicted. The depicted assembly 200 includes a fan 202, a heat sink 204, and an integral vibration isolation element-fan shroud 206 that receives and locates the fan 202 relative to the heat sink 204. In this embodiment, the vibration isolation element 206 serves the purpose of affixing the fan 202 to the heat sink 204 in place of the fan shroud 104 (FIG. 1) typically used in the currently produced fan-heat sink assemblies. The vibration isolation component 206 is produced from an elastomeric material, of which rubber is an example, having sufficient rigidity to receive the fan and a damping coefficient sufficient to reduce or eliminate the transmission of vibrational energy from the fan 202 to the heat sink 204.

Figure 3:
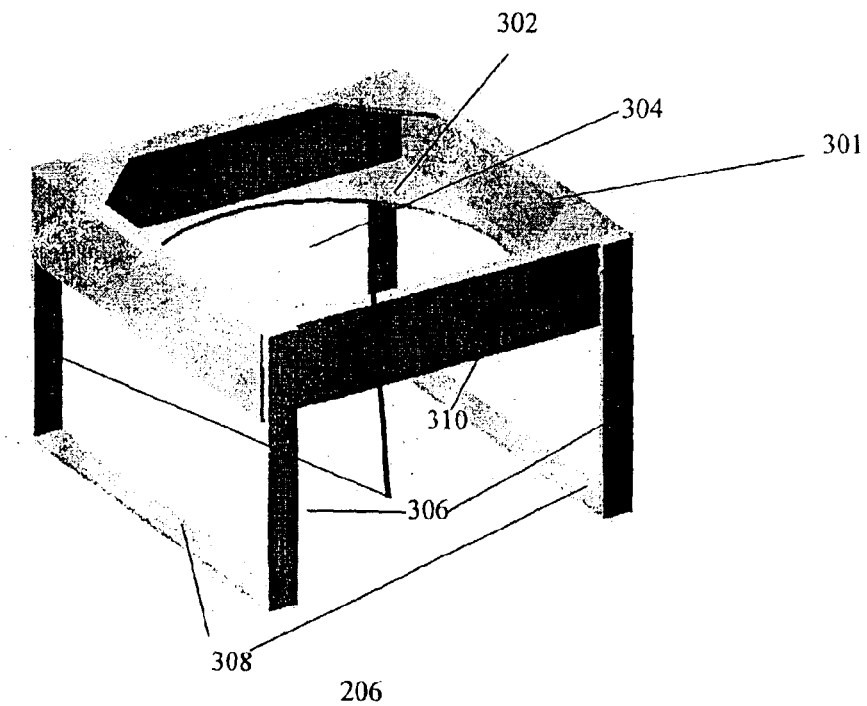
FIG. 3 depicts the integral fan shroud-vibration isolation component of FIG. 2 in greater detail.

Continuing, FIG. 3 depicts the integral vibration isolation component-fan shroud 206 of the embodiment depicted in FIG. 2. The vibration isolation component-fan shroud 206 includes a carrier structure 301 that defines a cavity 302 of dimensions matched to the dimensions of the fan 202. The carrier structure 301 includes a base that defines an opening 304 whose dimension matches the active area of the fan 202, allowing air flow through the vibration isolation component-fan shroud 206 and the heat sink 204, legs 306 and cross-bands 308 which connect opposing pairs of legs 306. An opening cavity 306 captures the top surfaces of the heat sink.

In use, the fan 202 is received into the cavity 302 of the integral vibration isolation component-fan shroud 206. Since the vibration isolation component-fan shroud 206 is made from an elastomeric material, it has an inherent compliance that allows the cavity 302 to deform a necessary to receive the fan 202 and then return to its original shape, retaining the fan 202. The dimensions of opening 304 in the floor of the fan cavity 302 match the dimensions of the active flow area of the fan 202. As the fan 202 spins under power, air moved by the fan 202 is free to flow through the opening 302. Since the fan 202 is encapsulated in the cavity 302 of the vibration isolation component-fan shroud 206, all air flow related to the fan 202 must go through the heat sink 204, increasing the cooling efficiency of the heat sink-fan assembly 200 by reducing air flow in non-useful directions. The fan-vibrational isolation-fan shroud subassembly is then affixed to the heat sink 204. The legs 306 and cross-bands 308 of the vibrational isolation component-fan shroud 206 act like elastic bands due to the elastomeric properties of the material of which it is made, to receive the heat sink 204, deforming as necessary to receive the heat sink 204 and then returning to their original dimensions, surrounding and retaining the heat sink 204 in position. The opposing cavity 310 conforms to the perimeter of the top surface of the heat sink 204, further insuring that all air flow moves through the pins or fins of the heat sink 204. The elastomeric material used for the integral vibrational isolation component-fan shroud may be a solid or foam elastomer, with its properties designed as required by the vibrational frequency of the energy whose transmission is to be eliminated or reduced and by the dimensional requirements of the mechanical assembly.

Figure 4:
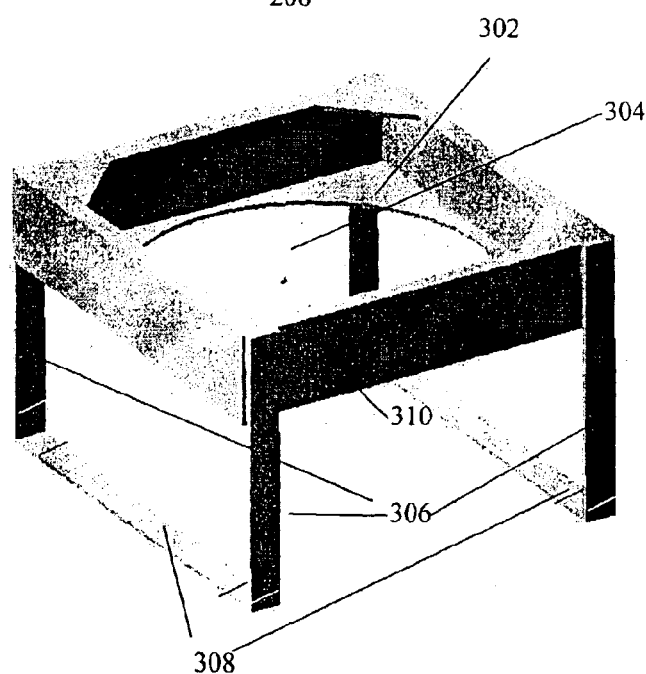
FIG. 4 depicts an embodiment of the integral fan shroud-vibration isolation component comprising co-molded polymer and elastomer elements.

FIG. 4 depicts an alternative embodiment of the integral vibration isolation component-fan shroud 400 produced using both an elastomeric material and a rigid polymer. A co-molding process may be used to produce the integral vibration isolation component-fan shroud 400 from the two materials. In this embodiment the fan receiving cavity 302 and opposing cavity 310 are produced from an elastomeric material which will receive and retain the fan 102. The legs 306 are made from a rigid polymer, while the cross-bands 308 are also produced from an elastomeric material. This embodiment provides increased mechanical stability before the integral vibration isolation component-fan shroud 400 is affixed to the fan 102 and the heat sink 110. The elastomeric material used within the integral vibrational isolation component-fan shroud may be a solid elastomer, or a foam elastomer, with its properties designed as required by the vibrational frequency of the energy whose transmission is to be eliminated or reduced and by the dimensional requirements of the mechanical assembly.

Figure 5:
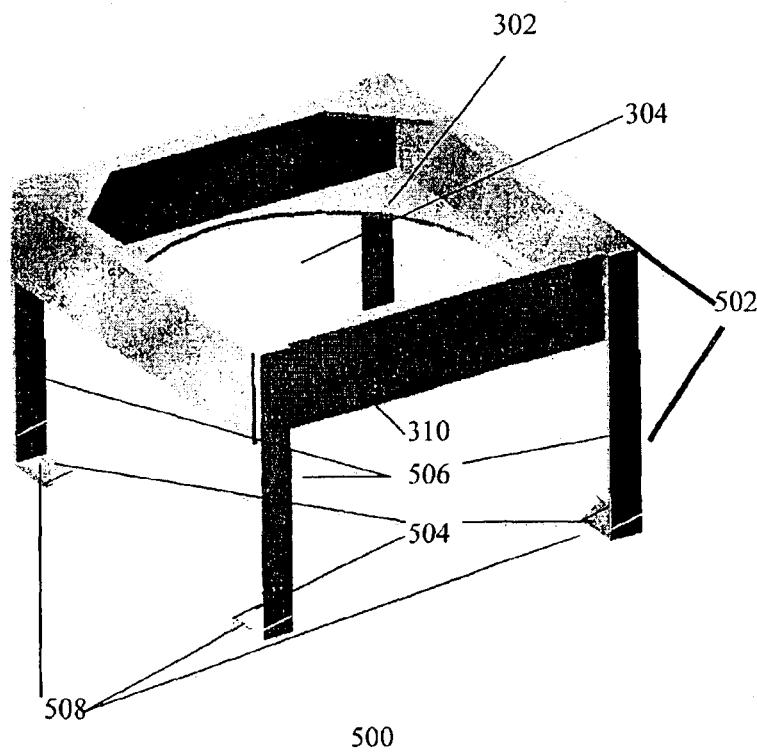
FIG. 5 depicts an embodiment of the integral fan shroud-vibrational isolation component comprising metal and elastomer elements.

FIG. 5 depicts an alternative embodiment of the integral vibration isolation component-fan shroud 500 produced using both an elastomeric material and a metal frame, similar to a conventional fan shroud 104. In this embodiment the metal frame 502 includes a frame, which is over-molded by the elastomer of the cavities 302 and 310, legs 506 and feet 508, which serve to affix the shroud 500 to the heat sink 110. Additional elastomer sections 504 are molded to the feet 116, isolating the heat sink from the vibration of the fan 102.

Figure 6:
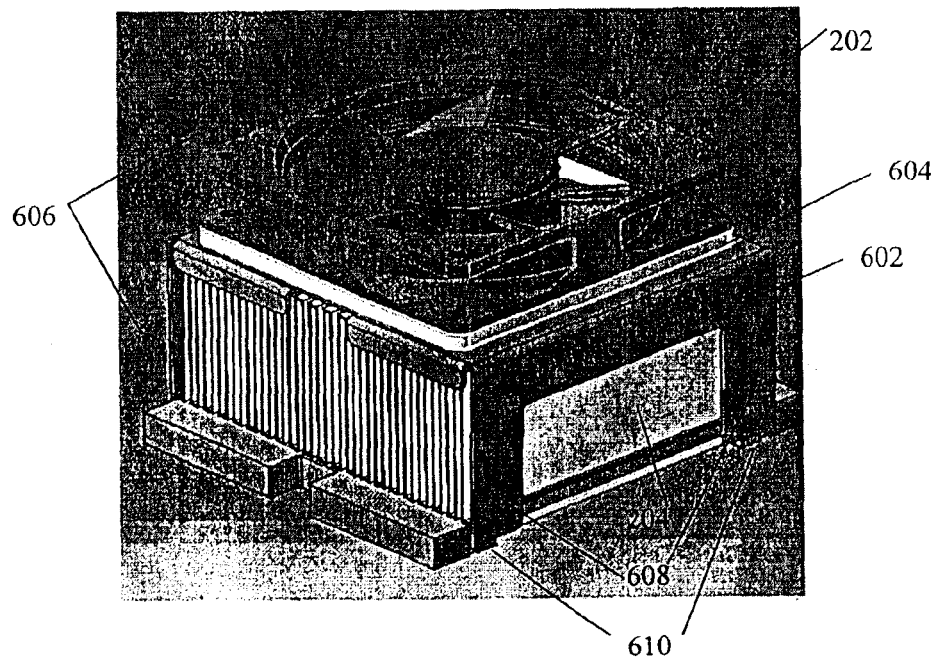
FIG. 6 depicts a fan sink assembly according to the present invention comprising a heat sink, a fan, a fan shroud, and a vibration isolation component that vibrationally isolates the fan and the fan shroud and affixes the fan to the fan shroud.

FIG. 6 depicts an alternative embodiment 600 including a fan 202, a heat sink 204, a fan shroud 602, and a vibration isolation component in the form of a gasket 604 which affixes both to the fan 202 and the fan shroud 602, producing a fan-fan shroud subassembly 606 and vibrationally isolating the fan 202 from the fan shroud 602. The elastomeric gasket 604 prevents transmission of vibrational energy from the fan 202 to the fan shroud 602. The fan-fan shroud subassembly 606 affixes to the base of the heat sink 204 by means of flexible legs 608 which are capable of deforming elastically a sufficient amount to allow the formed members or feet 610 at the base of the legs 608 to capture the heat sink 204 between opposing pairs of legs 608. The material from which the gasket 604 is made is an elastomeric material, of which natural rubber is an example. It may be a solid elastomer, molded to shape; a foam elastomer, molded to shape; a solid elastomer, stamped from a sheet; or a foam elastomer, stamped from a sheet.

Figure 7:
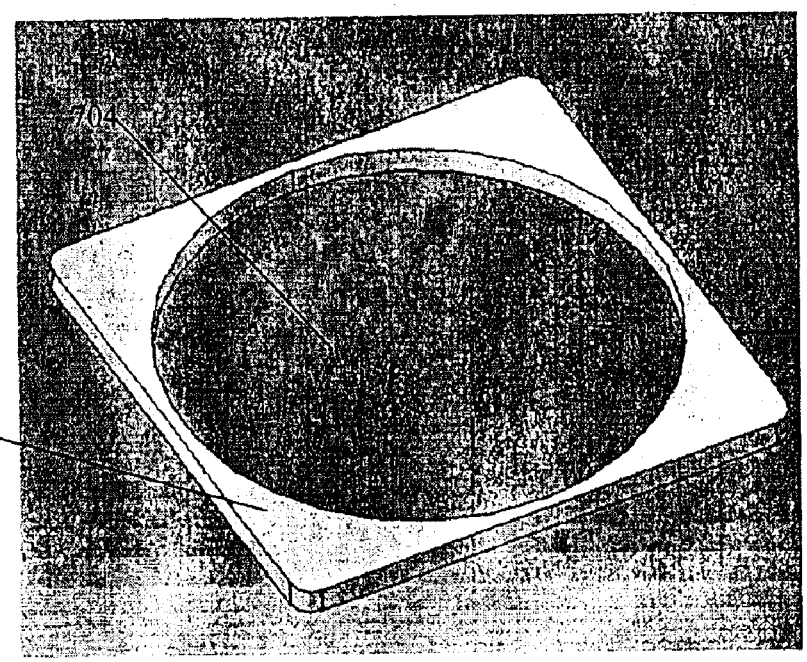
FIG. 7 depicts the vibration isolation component of the embodiment depicted in FIG. 6 emphasizing an elastomer element in the form of a gasket.

FIG. 7 depicts the vibration isolation gasket 604 of the embodiment depicted in FIG. 6. The gasket includes a geometric flat shape 702 approximating the shape and dimensions of the fan 202 and an opening 704 whose dimensions and shape are congruent to the dimensions and shape of the active area of the fan 202. Air moved by the fan 202 moves through the opening in the gasket 604 to reach the heat sink 204. An adhesive material, having the required resistance to heat, mechanical strength, and adherence may be dispensed on to one side of the gasket 604 and the gasket affixed to the fan shroud 602. Adhesive is then applied to the opposing side of the gasket 604 and the fan 202 is affixed to the fan shroud-gasket subassembly. The adhesive layers are cured, typically using a thermal process. The resulting fan-gasket-fan shroud subassembly is then affixed to the heat sink using the elasticity of the fan shroud legs 608 and the dimensions of the fan shroud feet 610 as depicted in FIG. 1.

Figure 8:
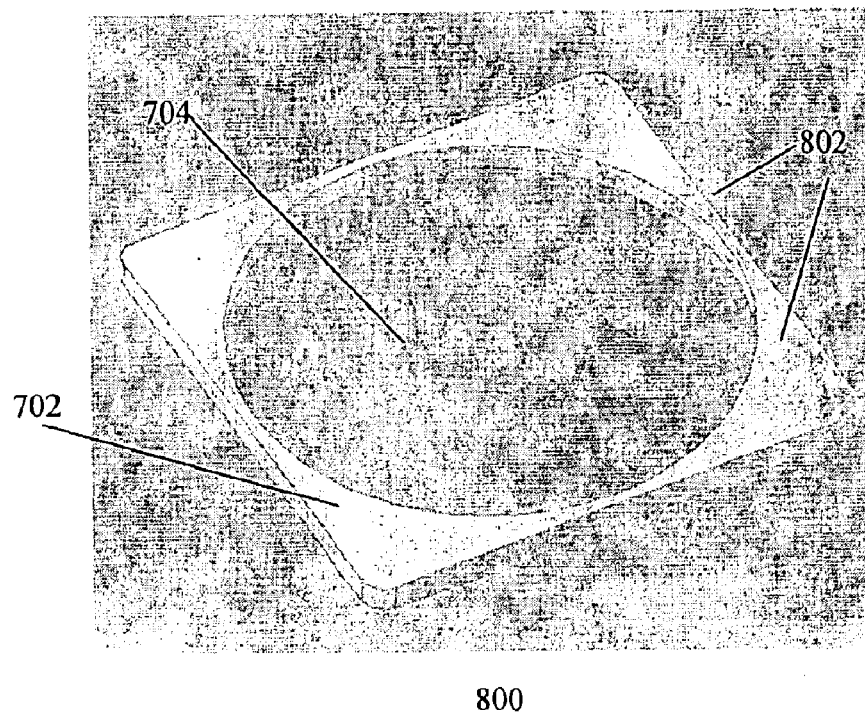
FIG. 8 depicts the vibration isolation component of the embodiment depicted in FIG. 6 emphasizing an elastomer gasket and pre-applied adhesive layers.

FIG. 8 depicts an alternative embodiment 800 of the gasket 604 depicted in FIG. 7. Before being assembled with the fan 202 (see FIG. 6) and the fan shroud 602 the gasket material is in the form of a flat sheet. The material may be a solid elastomer material or a foam elastomer material. Pressure sensitive adhesive 802 with a disposable release liner is laminated to opposing sides of the material from which the gasket 604 will be made, forming a composite sheet material. The geometry required by the dimensions of the fan, the outline of the flat shape 702 and the dimensions and location of the opening 704 in the gasket, is produced from the composite sheet material by a stamping process, producing the gasket-adhesive subassembly depicted in FIG. 8. To produce a fan-fan shroud sub-assembly, the disposable release liner is removed from the precut gasket-adhesive, exposing the press-sensitive adhesive. The gasket-adhesive material is then affixed by pressure to the fan 202. The disposable release liner is then removed from the free side of the gasket-adhesive combination, exposing the second adhesive surface. The second adhesive surface of the fan-adhesive sub assembly is then affixed to the fan shroud 602, with pressure applied to produce the bond.

It will be apparent to those skilled in the art having the benefit of this disclosure that the present invention contemplates an improved fan-fan shroud-heat sink assembly which includes a vibrational isolation component to reduce or prevent the transmission of vibration from the fan to the fan shroud and heat sink. The isolation of the vibrational energy produced by the fan thus reduces or eliminates the energy that can be radiated as acoustic noise by the heat sink-fan assembly, thus producing an acoustically quieter computer system. It is understood that the form of the invention shown and described in the detailed description and the drawings are to be taken merely as presently preferred examples. It is intended that the following claims be interpreted broadly to embrace all variations of the preferred embodiments disclosed.

What is claimed is:

1. A device for use in cooling a microelectronic component in a data processing system with a heat sink and a fan, comprising:
   a fan shroud including a carrier defining a cavity for receiving the fan, the fan shroud configured to maintain the fan in close proximity to the heat sink and in a position relative to the fan for moving air over the cooling surfaces of the heat sink; and
   wherein the fan shroud includes a component to vibrationally isolate the fan from the heat sink and reduce the transmission of fan vibration to the heat sink.

2. The device of claim 1, wherein the vibration isolation component comprises a base portion of the carrier.

3. The device of claim 2, wherein the vibration isolation component is further characterized as a solid elastomeric vibration isolation component.

4. The device of claim 2, wherein the vibration isolation component is further characterized as a foam elastomeric vibration isolation component.

5. The device of claim 2, wherein the shroud comprises:
   rigid legs to support the fan and attach to the heat sink; and
   an elastomeric element affixed to the fan.

6. The device of claim 1, wherein the vibration isolation component comprises a compliant gasket defining an opening to allow air flow generated by the fan to reach the heat sink.

7. The device of claim 6 in which the compliant gasket is a molded solid elastomer.

8. The device of claim 6 in which the compliant gasket is a molded foam elastomer.

9. An assembly for use in cooling a microelectronic component in a data processing system, comprising:
   a heat sink and a blower fan;
   a fan shroud including a carrier defining a cavity for encapsulating the fan, wherein the shroud maintains the fan in close proximity to the heat sink and in a position relative to the fan for moving air over the cooling surfaces of the heat sink; and
   wherein the fan shroud includes a component to vibrationally isolate the fan from the heat sink and reduce the transmission of fan vibration to the heat sink.

10. The assembly of claim 9, wherein the vibration isolation component comprises a compliant gasket defining an opening, and further wherein the fan shroud provides a surface defining an opening allowing airflow from the fan to reach the heat sink and wherein an adhesive material adheres the first surface of the compliant gasket to the fan and an opening surface to the fan shroud.

11. The assembly of claim 10 in which the compliant gasket is a molded solid elastomer.

12. The assembly of claim 10 in which the compliant gasket is a molded foam elastomer.

13. The device of claim 9, wherein the vibration isolation component is further characterized as a solid elastomeric vibration isolation component.

14. The device of claim 9, wherein the vibration isolation component is further characterized as a foam elastomeric vibration isolation component.

15. An apparatus for use in conjunction with dissipating heat generated by an integrated circuit with a heat sink and a fan, comprising a vibration isolation component integrated with a fan shroud component wherein the fan shroud attaches the fan to the heat sink and wherein the vibration isolation component is disposed between the fan and the heat sink and wherein the isolation component is configured to reduce the transmission of fan vibration to the heat sink and wherein the fan shroud includes a carrier defining a cavity sized to encapsulate the fan wherein a base of the carrier structure provides the vibration isolation element and defines an opening.

16. The apparatus of claim 15, further comprising legs and cross-bands connecting opposing pairs of legs, the legs extending from the base and having a length approximately the height of the heat sink wherein the cross-bands and legs are configured to surround a perimeter of the heat sink.

17. The apparatus of claim 16, wherein the legs and cross-bands comprise a rigid polymer and wherein the carrier structure and the vibration isolation element comprise an elastomer.

* * * * *